United States Patent

[11] 3,603,817

[72] Inventor Charles F. Casson
Winslow, Ind.
[21] Appl. No. 766,510
[22] Filed Oct. 10, 1968
[45] Patented Sept. 7, 1971
[73] Assignee AMF Incorporated

[54] SOLID STATE ALTERNATING CURRENT SWITCH MEANS FOR SELECTIVE ENERGIZATION OF PARALLEL LOADS
12 Claims, 1 Drawing Fig.

[52] U.S. Cl. .......... 307/252 B, 307/252 Q, 307/305, 323/22 SC
[51] Int. Cl. .......... H03k 17/00
[50] Field of Search .......... 307/252, 305; 321/45; 317/148.5, 33 SC; 323/22 SC

[56] References Cited

UNITED STATES PATENTS

| | | | |
|---|---|---|---|
| 3,484,623 | 12/1969 | Cain | 307/252 |
| 3,517,217 | 6/1970 | Sleater | 307/252 |
| 3,176,150 | 3/1965 | McMurray | 307/252 |
| 3,337,741 | 8/1967 | Mislan | 307/252 |

OTHER REFERENCES

Galloway, using the trial for control of AC power, 3/66, pp. 4 & 17.

*Primary Examiner*—Donald D. Forrer
*Assistant Examiner*—David M. Carter
*Attorneys*—George W. Price and Charles J. Worth

ABSTRACT: An AC load circuit having first and second loads connected in parallel is provided with switching means for selectively energizing such loads including first and second bilateral semiconductor triodes of the thyristor type connected by their power electrodes in series between their respective loads and opposite sides of an AC source, a control switch and first coupling resistance connecting the gate electrode of the first triode and a second coupling resistance connecting the gate electrode of the second triode to the source and load connected electrodes, respectively, of the first triode.

PATENTED SEP 7 1971 3,603,817
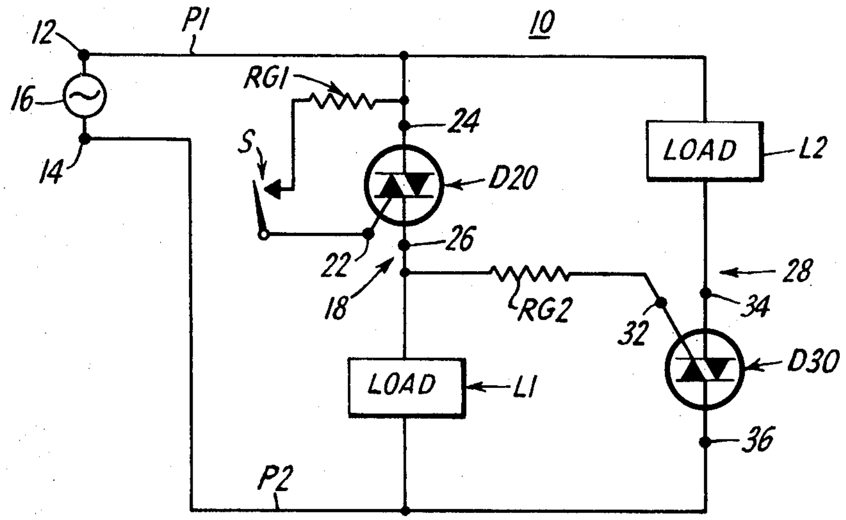
INVENTOR.
CHARLES F. CASSON
BY Charles J. Worth
AGENT

SOLID STATE ALTERNATING CURRENT SWITCH MEANS FOR SELECTIVE ENERGIZATION OF PARALLEL LOADS

This invention relates to solid state switching means and more particularly to a solid state controlled load circuit for parallel connected loads whereby selective energization of the said loads is effected by solid state switching devices of the bilateral semiconductor type.

It is an object of the present invention to provide new and novel load circuit for selectively energizing parallel connected loads from an alternating current source by means of solid state switching devices comprising bilateral semiconductor triodes of the thyristor type.

It is another object of this invention to provide new and novel load circuit for selectively energizing parallel connected loads from an alternating current source by means of solid state switching devices comprising bilateral semiconductor triodes of the thyristor type; and wherein full-wave energization of the said loads is effected with the use of an optimally minimum number of solid state switching devices.

Another object of this invention is to provide a solid state controlled alternating current load switching circuit for selective energization of a plurality of parallel connected loads, wherein full-wave energization of such loads is effected by the use of a single bilateral thyristor triode in series with each load to be energized.

The foregoing and other objects and advantages will appear more fully hereinafter from a consideration of the detailed description which follows, taken together with the accompanying drawing wherein one embodiment of the invention is illustrated by way of example. It is to be expressly understood, however, that the drawing is for illustration purposes only and is not to be construed as defining the limits of the invention.

The drawing is a schematic diagram of an alternating current load circuit embodying the invention.

Basically, the invention contemplates the use of the bilateral gating properties of bilateral thyristor triodes to effect selective full-wave energization of parallel connected loads in an alternating current load circuit. In a two load circuit, for example, a first bilateral thyristor triode is connected with its power path in series with a first load across a source of alternating current and a second bilateral thyristor triode is connected in like manner but in reverse order with a second load across the same source. Therefore, the bilateral thyristor diodes have one power electrode connected to a respectively opposite side of the alternating current source, and the two loads are respectively connected from the remaining power terminals of the bilateral triodes to the opposite sides of the source.

The bilateral thyristor triodes are each provided with a gate electrode. The first bilateral thyristor triode has an independent gating circuit while the second bilateral thyristor triode has its gate electrode connected through a coupling junction intermediate the first bilateral thyristor triode and the first load.

In this configuration, the application of alternating current power to the load circuit normally renders the second bilateral thyristor triode conductive for each half-cycle of applied alternating current and energizes the second load. The second bilateral thyristor triode is extinguished and the second load deenergized by selective closing of the independent gating circuit of the first bilateral thyristor triode, rendering the latter conductive and energizing the first load.

Referring in detail to the drawing, an alternating current load circuit 10 is shown as including first and second input terminals 12 and 14 connected, respectively, to first and second power leads P1 and P2, and adapted to be connected as shown, across an alternating current source 16.

A first load branch 18 is shown as comprising a first bilateral semiconductor (thyristor) triode D20 having a gate electrode 22 and first and second power electrodes 24 and 26 having the said first power electrode 24 connected at the first power lead P1; a first load L1 connected from the second power electrode 26 to the second power lead P2; and a gate circuit comprising, a switch S connected in series from the gate terminal 22, through a first coupling resistance means RG1 to the first power electrode 24.

A second branch circuit 28 is shown as comprising a second bilateral semiconductor (thyristor) triode D30 having a gate electrode 32 and first and second power electrodes 34 and 36; the said second power electrode 36 being connected at the second power lead P2; a second load L2 connected from the first power lead P1 to the first power electrode 34; and a gate circuit comprising a second coupling resistance means RG2 connected from the gate electrode 32 to the second power electrode 26 of the first bilateral triode D20, i.e., the common junction between the latter and the first load L1.

A bidirectional thyristor or bilateral semiconductor is a monostable solid state device which can be triggered or driven from a blocking or nonconducting state when quiescent, exhibiting a high impedance, to a conducting state, exhibiting a very low impedance. The device turns off or returns to its quiescent or nonconducting state when the current being conducted drops below that required as a holding current if a shunt is provided or when the current approaches the zero crossover. Stated in another way, such devices, hereafter considered as switch devices, are turned on when they are triggered from the quiescent nonconducting state to the conducting state which must be maintained by a holding current, and are turned off to return from the conducting state to the nonconducting state when the current conducted thereby drops below the required holding current. Such triggering consumes on the order of a very few microseconds which, for practicable purposes, can be considered to be instantaneous, and can be accomplished by an applied voltage of either positive polarity or negative polarity. Once triggered to the conductive state, the device can conduct current in either direction.

Bilateral semiconductor triodes (D20 and D30 herein) are solid state switching devices which will conduct current through the power electrodes thereof in either direction when rendered conductive (i.e., turned "ON") by the application of a small gate signal of either positive or negative polarity to the gate electrodes thereof or by the voltage across the power electrodes thereof or by the voltage across the power electrodes exceeding the rated breakover voltage in either direction. These devices are rendered nonconductive (i.e., turned "OFF") in the manner described above.

In operation, assuming that the switch S in the gate circuit of the first bilateral thyristor triode D20 is open and that the source 16 is energized, the potential difference between the power leads P1 and P2 will place the gate electrode 32 of the second bilateral thyristor triode D30 at either a positive or negative potential with respect to the first power electrode 34 thereof, through the circuit path L2—34—32—RG2—L1. This will cause, at some point in each half-cycle of the alternating current wave in the circuit 10, a flow of gating current into or out of the gate electrode 32, of a sufficient magnitude to render the second bilateral thyristor triode D30 conductive, completing a circuit therethrough via the power electrodes 34 and 36, energizing the second load L2 and completely shunting the first load L1, rendering it fully deenergized. The only energization of the first load L1, in the absence of a conductive state of the first bilateral thyristor triode D20, is a flow of a relatively small gating current into or out of the gate electrode 32 of the second bilateral thyristor triode D30 during each half-cycle of the applied alternating current wave in the load circuit 10.

When it is desired to energize the first load L1 and deenergize the second load L2, the switch S in the gate circuit of the first bilateral thyristor triode D20 is closed, completing a circuit path P1—RG1—S—22—26—L1—P2 such that during each half-cycle the gate electrode 22 of the said first bilateral triode D20 is either positive or negative with respect to the second power electrode 26. This causes a gating current to flow into or out of the gate electrode 22 on each half-cycle of the alternating current wave applied to the load circuit 10.

As a result, the first bilateral thyristor triode D20 is rendered conductive at some point in time during each half-cycle of the applied alternating current wave in the load circuit 10.

Both of the bilateral thyristor triodes D20 and D30 are switched to the nonconductive ("OFF") state as the applied alternating current wave approaches its zero crossover, during which time the current therethrough drops below the minimum holding value to maintain the said triodes in the conductive ("ON") state.

With this characteristic response, when the first bilateral thyristor triode D20 is switched to the "ON" state, substantially the entire line voltage between the power leads P1 and P2 is substantially instantaneously placed across the load L1, and there is no longer a voltage differential between the gate electrode 32 and first power electrode 34 of the second bilateral thyristor triode D30 since both ends of the circuit path P1—L2—34—32—RG2 are tied to the same potential.

Accordingly, toward the completion of the immediate half-cycle of the applied alternating current wave, the second bilateral thyristor triode D30 is switched "OFF" and the second load L2 is deenergized.

Subsequent opening of the gate circuit switch S will remove the gating potential from the gate electrode 22 of the first bilateral thyristor triode D20, causing the latter to switch "OFF" toward the termination of the immediate half-cycle of the applied alternating current wave and deenergize the first load L1 with the exception of the above-described flow of gating current into or out of the gate electrode 32 of the second bilateral thyristor triode D30, thereby restoring the latter to its "ON" state in the next immediate half-cycle of the applied alternating current wave and energizing the second load L2.

The present invention provides a switching means for parallel connected alternating current loads which can be produced as a modular unit including the first and second bilateral thyristor triodes D20 and D30, switch S, first and second coupling resistances RG1 and RG2 and associated circuitry, together with three external terminal pairs, the latter comprising the pair of input terminals 12 and 14 and a pair of load terminals for external connection of each of the first and second loads L1 and L2.

Alternatively, the switch S can be externally connected if a fourth pair of external terminals is provided in a modular structure containing the first and second bilateral triodes D20 and D30, the first and second coupling resistance RG1 and RG2, and associated circuitry.

The reference to a plurality of external terminal pairs is not intended to preclude the inclusion of a given terminal in more than one pair where common connections can be effected.

As can be readily seen from the foregoing specification and drawing, the present invention provides a new and novel alternating current load circuit and solid state switching means for selective energization of parallel connected loads, which utilizes an optimally minimum number of solid state switching components, one for each load, and effects full-wave energization of each of said loads.

Although a single embodiment of the invention has been illustrated and described in detail, it is to be expressly understood that the invention is not limited thereto. Various changes may be made in the design and arrangement of the parts without departing from the spirit and scope of the invention as the same will now be understood by those skilled in the art.

I claim:

1. For use in an alternating current load circuit for selectively energizing each of a pair of load means to the exclusion of the other, solid state switching apparatus comprising:

a pair of power leads adapted to be connected with a source of alternating current power;

first and second load means connected in parallel across said power leads;

first and second bilateral semiconductor switch means each having first and second power electrode means connected in series with a respective one of said first and second load means, and a gate electrode means;

one of said power electrode means of said first bilateral switch means being connected with one of said power leads and one of said power electrode means of said second bilateral switch means being connected with the other of said power leads;

gating circuit means including both said gate electrode means selectively rendering said first and second bilateral semiconductor switch means conductive and nonconductive, respectively; and said gating circuit means further including switch circuit means selectively coupling said gate electrode means of said first bilateral semiconductor switch means with said one of said power leads.

2. The invention defined in claim 1, wherein said switch circuit means comprises make and break switch means and resistance means connected in series between said gate electrode means and said one of said power leads.

3. The invention defined in claim 1, wherein said gating circuit means includes resistance means interconnecting said gate electrode means of said second bilateral semiconductor switch means and the other of said power electrode means of said first bilateral semiconductor switch means.

4. The invention defined in claim 4, wherein said switch circuit means comprises make and break switch means and resistance means connected in series between said gate electrode means of said first bilateral semiconductor switch means and said one of said power leads.

5. The invention defined in claim 4, wherein said first and second bilateral semiconductor switch means comprise first and second bilateral thyristor triodes respectively.

6. The invention defined in claim 1, wherein said first and second bilateral semiconductor switch means comprise first and second bilateral thyristor triodes, respectively.

7. An alternating current load circuit effecting selective energization of parallel connected loads from a source of alternating current, comprising:

a pair of power leads adapted to be connected to opposite sides of a source of alternating current;

first and second branch circuits connected across said power leads;

said first branch circuit including a first load means and a first bilateral semiconductor switch means having a bilaterally conductive current path therethrough connected in series between one of said power leads and said first load means;

said second branch circuit including a second load means and a second bilateral semiconductor switch means having a bilaterally conductive current path therethrough connected in series between the other of said power leads and said second load means;

said first and second bilateral semiconductor switch means having first and second gate terminals,, respectively; and gating circuit means including said first and second gate terminals selectively rendering said current paths of said first and second bilateral semiconductor switch means conductive and nonconductive, respectively, to selectively complete a circuit through said first and second load means across said power leads when said power leads are energized by a source of alternating current.

8. The invention defined in claim 7, wherein said first and second bilateral semiconductor switch means comprise first and second bilateral thyristor triodes, respectively.

9. The invention defined in claim 7, wherein said gating circuit means comprises make and break switch means and first resistance means connected in series between said first gate terminal and said one of said power leads and second resistance means connected in series with said first load means between said second gate terminal and said other of said power leads.

10. The invention defined in claim 7, wherein said gating circuit means comprises make and break switch means and first resistance means connected in series between said first gate terminal and said one of said power leads and second resistance means connected in series with said first load means between said second gate terminal and said other of said power leads; and further wherein said first and second bilateral semiconductor switch means comprise first and second bilateral thyristor triodes, respectively.

11. The invention defined in claim 7, wherein said gating circuit means comprises switch circuit means selectively coupling said first gate terminal to said one of said power leads and second circuit means connected in series with said first load means between said second gate terminal and the other of said power leads.

12. The invention defined in claim 11, wherein said gating circuit means comprises make and break switch means and first resistance means connected in series between said first gate terminal and said one of said power leads and second resistance means connected in series with said first load means between said second gate terminal and said other of said power leads; and further wherein said first and second bilateral semiconductor switch means comprises first and second bilateral thyristor triodes, respectively.